(12) United States Patent
Heck et al.

(10) Patent No.: US 7,358,615 B2
(45) Date of Patent: Apr. 15, 2008

(54) MICROELECTRONIC PACKAGE HAVING MULTIPLE CONDUCTIVE PATHS THROUGH AN OPENING IN A SUPPORT SUBSTRATE

(75) Inventors: John Heck, Berkeley, CA (US); Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 11/240,750

(22) Filed: Sep. 30, 2005

(65) Prior Publication Data

US 2007/0077747 A1 Apr. 5, 2007

(51) Int. Cl.
*H01L 29/40* (2006.01)
*H01L 21/44* (2006.01)

(52) U.S. Cl. ...................... 257/776; 438/667
(58) Field of Classification Search ........... 438/280, 438/619; 257/773–776, E23.141–E23.179
See application file for complete search history.

(56) References Cited

U.S. PATENT DOCUMENTS

| | | | |
|---|---|---|---|
| 5,024,966 A * | 6/1991 | Dietrich et al. ........... 438/23 |
| 6,154,366 A | 11/2000 | Ma et al. |
| 6,229,216 B1 | 5/2001 | Ma et al. |
| 6,238,954 B1 | 5/2001 | Ma et al. |
| 6,271,469 B1 | 8/2001 | Ma et al. |
| 6,400,172 B1 | 6/2002 | Akram et al. |
| 6,423,570 B1 | 7/2002 | Ma et al. |
| 6,562,653 B1 | 5/2003 | Ma et al. |
| 6,586,822 B1 | 7/2003 | Vu et al. |
| 6,586,836 B1 | 7/2003 | Ma et al. |
| 6,621,137 B1 | 9/2003 | Ma et al. |
| 6,673,697 B2 | 1/2004 | Ma et al. |
| 6,709,898 B1 | 3/2004 | Ma et al. |
| 6,713,314 B2 | 3/2004 | Wong et al. |
| 6,713,859 B1 | 3/2004 | Ma |

(Continued)

FOREIGN PATENT DOCUMENTS

DE 19842080 12/1999

(Continued)

OTHER PUBLICATIONS

PCT/US2006/037646 International Search Report, Sep. 27, 2007, 3 pages.

*Primary Examiner*—Calvin Lee
(74) *Attorney, Agent, or Firm*—Blakely, Sokoloff, Taylor & Zafman LLP (57) ABSTRACT

Microelectronic packages are disclosed. A microelectronic package may include a substrate having first and second sides. Passive components may be located on the first side of the substrate. Interconnects may also be located on the first side of the substrate, and may be electrically coupled with the passive components. Microelectronic components may be located on the first side of the substrate and may be electrically coupled with interconnects. The substrate may include an opening therein. The opening may lead from the second side of the substrate toward the first side of the substrate. A plurality of conductive paths may be at least partially included in the opening. Each of the conductive paths may lead from the second side of the substrate toward the first side of the substrate to communicate electrical signals to interconnects. Methods of making the packages and electronic devices including the packages are also disclosed.

23 Claims, 6 Drawing Sheets

U.S. PATENT DOCUMENTS

| | | |
|---|---|---|
| 6,737,754 B2 | 5/2004 | Ma et al. |
| 6,740,427 B2 | 5/2004 | Datta et al. |
| 6,794,223 B2 | 9/2004 | Ma et al. |
| 6,852,063 B2 | 2/2005 | Takahashi et al. |
| 6,852,926 B2 | 2/2005 | Ma et al. |
| 6,890,829 B2 | 5/2005 | Cheng et al. |
| 6,903,452 B2 | 6/2005 | Ma et al. |
| 6,943,419 B2 | 9/2005 | Wong et al. |
| 6,964,889 B2 | 11/2005 | Ma et al. |
| 7,061,099 B2 | 6/2006 | Lu et al. |
| 7,095,372 B2 * | 8/2006 | Soler Castany et al. .... 343/700 MS |
| 7,170,155 B2 | 1/2007 | Heck et al. |
| 7,183,622 B2 | 2/2007 | Heck et al. |
| 7,189,596 B1 | 3/2007 | Mu et al. |
| 2001/0018236 A1 | 8/2001 | Badehi |
| 2003/0151124 A1 | 8/2003 | Badehi |
| 2004/0076797 A1 | 4/2004 | Zilber et al. |
| 2004/0195669 A1 | 10/2004 | Wilkins et al. |
| 2004/0251525 A1 | 12/2004 | Zilber et al. |
| 2005/0104179 A1 | 5/2005 | Zilber et al. |
| 2005/0105225 A1 | 5/2005 | Ahn et al. |
| 2005/0205977 A1 | 9/2005 | Zilber et al. |

FOREIGN PATENT DOCUMENTS

| | | |
|---|---|---|
| DE | 10227305 | 9/2003 |
| EP | 1041631 | 10/2000 |
| WO | WO-0060662 | 10/2000 |

* cited by examiner

MICROELECTRONIC PACKAGE HAVING MULTIPLE CONDUCTIVE PATHS THROUGH AN OPENING IN A SUPPORT SUBSTRATE

BACKGROUND

1. Field

One or more embodiments of the invention relate to a microelectronic package. In particular, one or more embodiments of the invention relate to a microelectronic package having multiple conductive paths through an opening in a support substrate.

2. Background Information

Microelectronic packages are used in numerous electronic devices including wireless devices. Some wireless devices include microelectronic packages known as front end modules (FEMs). By way of example, the FEMs may perform signal transmit and/or receive functions and associated signal filtering.

The FEMs may include several die from diverse processes. Representatively, the die may include power amplifiers, low-noise amplifiers, and solid-state switches. The die may be assembled onto a substrate. Plastic and ceramic substrates having discrete passive components connected thereto have previously been used for packages.

In such packages, the routing of signals from an external signaling medium, such as a circuit board, to the die, may be challenging. Numerous holes may be included in the substrate to convey electronic signals and ground. The holes may potentially increase the size of the package and/or reduce the strength of the substrate.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1A:
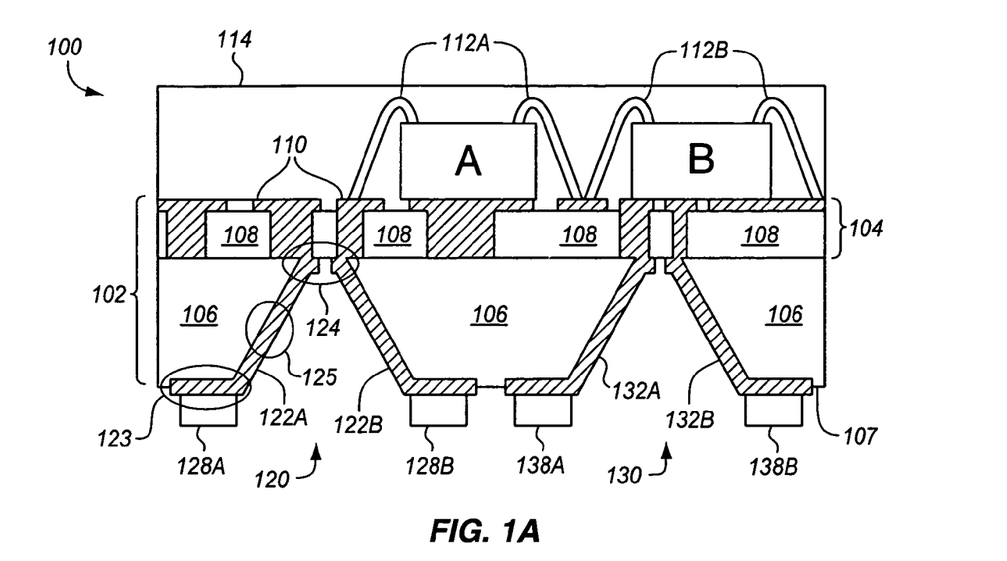
FIG. 1A is an enlarged cross-sectional view of a microelectronic package, according to one or more embodiments of the invention.
Figure 1B:
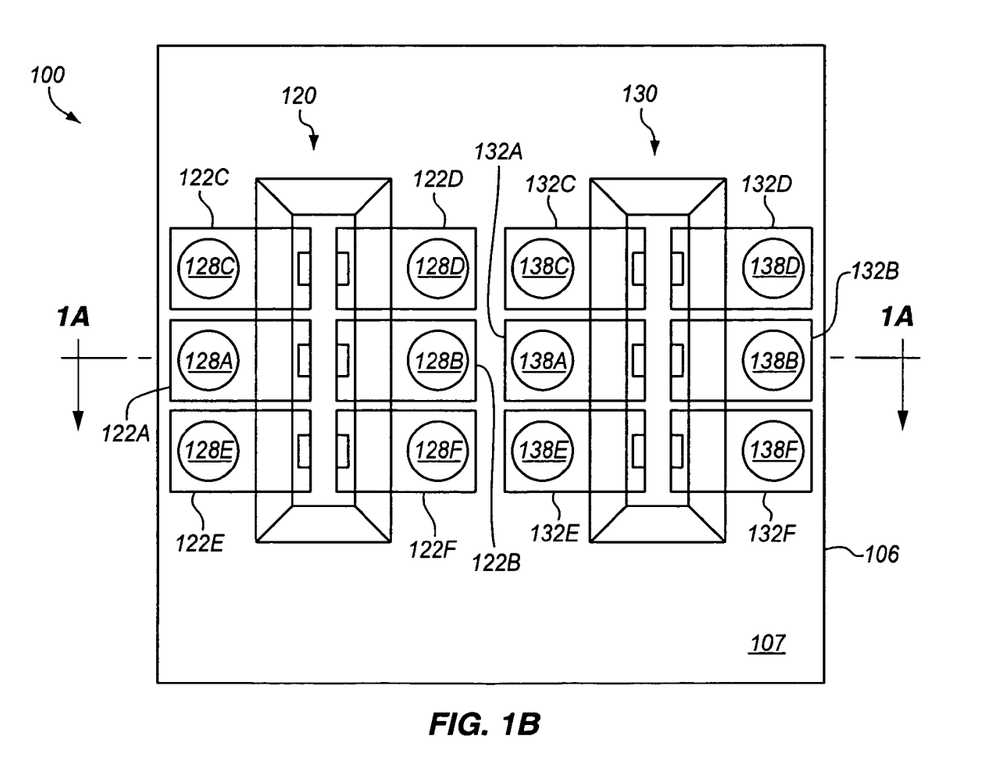
FIG. 1B is a bottom planar view of the microelectronic package of FIG. 1A, according to one or more embodiments of the invention.

FIGS. 1A and 1B show enlarged views of a microelectronic package 100, according to one or more embodiments of the invention. In particular, FIG. 1A shows a cross-sectional view of the microelectronic package and FIG. 1B shows a bottom planar view of the microelectronic package. The section line 1A—1A shown in FIG. 1B shows the location of the cross-section used for FIG. 1A.

The structure of the microelectronic package is perhaps easiest viewed in the cross-sectional view of FIG. 1A. Referring first to FIG. 1A, the microelectronic package is shown to include a first component (A) and a second component (B). In one or more embodiments of the invention, the first and second components may represent semiconductor die that have been fabricated by different fabrication processes. As used herein, the terms "die" and "dice" (dice is the plural of die) will be used to refer to portions of semiconductor material, often thin rectangular portions, having a side on which electrical circuits may have been fabricated, and another side which may be devoid of electrical circuitry and that may be attached to a support. The dice will commonly be obtained from one or more conventional semiconductor substrates or wafers that contain the desired electrical circuits formed therein by conventional approaches. After optional thinning, the wafer may be cut into the die portions, for example with a dicing saw. A die may also be referred to as a chip, monolithic device, semiconductor device, integrated circuit, or microelectronic device. In one particular embodiment of the invention, the components may include different components selected from power amplifiers, low noise amplifiers, and solid-state switches. The scope of the invention is not limited to any known types of components. Additionally, fewer or more than two components may be included in the package.

The first and second components are coupled with a substrate 102. In the description and claims, the terms "coupled" and "connected," along with their derivatives, may be used. It should be understood that these terms are not intended as synonyms for each other. Rather, in particular embodiments, "connected" may be used to indicate that two or more components are in direct physical or electrical contact with each other. "Coupled" may mean that two or more components are in direct physical or electrical contact. However, "coupled" may also mean that two or more components are not in direct contact with each other, but yet still co-operate or interact with each other. For example, two or more components may be coupled with one another via one or more intervening components. In addition, two or more components may be in communication with one another if they exchange data or information, regardless of whether they are in direct contact or not.

The substrate may also be referred to herein as a semiconductor backplane or silicon backplane. The substrate or semiconductor backplane may include a workpiece object having portions thereof that have been transformed by a sequence of operations into microelectronic structures, devices, circuits, or other microelectronic configurations. In one aspect, the substrate or semiconductor backplane may include a silicon die or other portion of silicon or other semiconductor that has been singulated or otherwise separated from a processed wafer. The substrate or semiconductor backplane may include a semiconductor material, such as, for example, silicon, as well as non-semiconductor materials, such as, for example, metals and/or other conductors, and polymeric dielectrics and/or other non-conductors. Accordingly, as used herein, the term semiconductor backplane may refer to a substrate including a semiconductor material and potentially other materials, such as, for example, metals, and having microelectronic configurations, such as, for example, interconnects and semiconductor devices, fabricated thereon.

The illustrated substrate includes a device and interconnect layer or portion 104 and a patterned support layer or portion 106. The device and interconnect layer or portion includes a plurality of semiconductor devices 108, such as, for example, passive components, and interconnects 10. Passive components are sometimes referred to simply as passives. Suitable passive components include, but are not limited to, capacitors and inductors. The passive components and/or other semiconductor devices may be fabricated on and/or from the substrate by semiconductor manufacturing operations, such as, for example, thin film deposition, lithography, etching, and the like. Use of the semiconductor backplane having the passive components fabricated thereon may help to avoid the need to separately assemble discrete passive components on a printed circuit board or other support substrate, which may tend to be time consuming, costly, and may tend to increase the physical size of the microelectronic package.

The interconnects 110 may include microelectronic structures including electrically conductive materials to electrically couple the passive components or other semiconductor devices with one another and with other components, as will be described further below. The interconnects generally represent a conductive path, link, or signaling medium to carry electrical signals. In various embodiments of the invention, the interconnects may include surface metallization structures and configurations, such as, for example, traces, wires, lines, filled vias, pads, bondpads, bumps, other patterned metals or other conductive materials, and combinations thereof. Metals are commonly employed in the interconnects, due, at least in part, to their high conductivities. Accordingly, the interconnects are sometimes referred to in the art as surface metallization. As used herein, a metal or metallization may include pure metals as well as alloys, stacks, and other combinations of multiple different metals. Often, a highly conductive metal, such as gold, platinum, copper, aluminum, or the like, or combinations thereof, may be used to provide a highly conductive low-resistance signaling medium. However, the use of highly conductive metals is not required and other conductive materials, such as, for example, less conductive metals, refractory metal silicides, conductive polysilicon, and/or doped semiconductors, may also optionally be used. The patterned or structured conductive materials are often provided within a non-conducting or insulating material, such as, for example, an oxide or polymeric dielectric material. These are just a few examples, and the scope of the invention is not limited by the interconnects.

Referring again to Figure 1A, the components A and B are coupled with, or otherwise in communication with, the substrate or semiconductor backplane. In particular, as shown in the illustrated embodiment, the component A may be coupled with the interconnects of the substrate through a first set of wirebonds 112A. Likewise, the component B may be coupled with the interconnects or surface metallization through a second set of wirebonds 112B. By way of example, the wirebonds may include highly conductive metal wires, such as, for example, gold wires. However, the use of wirebonds is not required. In one or more embodiments of the invention, the components (A) and (B) may optionally be coupled with, or otherwise in communication with, the interconnects by flipchip joints.

As shown, the package may include a protective encapsulant material 114, such as, for example, a solidified mold compound. As shown, the molding compound or other protective material may be disposed on or over the device and interconnect layer or portion of the substrate, on or over the exposed surfaces of the components A and B, and around the wirebonds if they are included. By way of example, a liquid molding compound may be dispensed, or flowed, or otherwise introduced to these locations, and thereafter cured, cooled, or otherwise solidified. The solidified protective material may provide mechanical strength, protection, and potentially a hermetic seal to protect against environmental moisture. Many conventional molding compounds, such as, for example, epoxy molding compounds, phenol-formaldehyde molding compounds, filled molding compounds, silicon based molding compounds, and other protective materials commonly used in packaging, are suitable.

Referring again to FIG. 1A, openings 120, 130 are included through the support layer or portion of the substrate or semiconductor backplane, and multiple different discrete conductive paths 122A-B, 132A-B are included in each of the openings. In particular, a first opening 120 is included on the left-hand side of the package, as viewed, and a second opening 130 is included on the right-hand side of the package. A first conductive path 122A and a second conductive path 122B are included in the first opening. Likewise, a third conductive path 132A and a fourth conductive path 132B are included in the second opening.

The openings may also be referred to herein as holes. As shown, the openings or holes may be defined or housed, at least in part, by the substrate. In particular, the openings may be included through the entire thickness of the support layer or portion of the substrate or semiconductor backplane. The openings may lead from the back side of the substrate towards or to the front side of the substrate.

First the openings will be discussed, and then the multiple conductive paths included within each opening will be discussed. The openings may each have a first closed end and a second open end. The first closed ends may reside generally at an interface between the support portion of the substrate and the device and interconnect portion of the substrate. In one or more embodiments of the invention, the interconnects may include landing pads that may serve as an etch stop of a high-aspect-ratio lithographic etch used to form the openings, although the scope of the invention is not limited in this respect. The second open ends may reside at opposite ends of the openings from the first closed ends and may open from a back side major surface 107 of the substrate. As shown, the ends of the openings at the back side surface may optionally be larger, such as, for example, longer and wider, than the opposite ends of the openings at the interface between the support portion and the device and interconnect portion of the substrate.

It should be noted that terms such as, for example, "front", "back", "top", "bottom", "right", "left", "vertical", and the like, are used herein to facilitate the description of the structure of the package as illustrated. It will be evident that the apparatus may be used in a variety of orientations including, but not limited to, an inverted orientation.

Walls may connect the first closed end and the second open end. As shown, the walls need not be vertical, but rather may be slanted, sloped, beveled, or otherwise non-orthogonal relative to the horizontal back side surface of the substrate. As shown, the openings may have a "v-shaped" cross section with the apex of the "v" closest to the front side of the substrate potentially removed. As will be explained further below, in one or more embodiments of the invention, the walls of the openings may be formed by etching or otherwise removing material preferentially against a crystal plane or other material boundary of the substrate. For example, an anisotropic etch may be used to etch against a silicon (1 1 1) surface or plane to achieve walls that are slanted inward toward the opening with an angle of about 54° relative to the back side surface of the substrate, although the scope of the invention is not so limited. In practice, the angle may not be exactly 54° and the "about" is used herein to encompass variations of several degrees in either direction.

Now the conductive paths will be discussed. At least a portion of each of the conductive paths is included in an opening and is disposed between a first closed end and a second open end. At least one of the openings includes a plurality of conductive paths therein. Each of the conductive paths may lead from the back side of the substrate toward or to the front side of the substrate. Each of the conductive paths includes a first terminal end or portion, a second terminal end or portion, and a central length or portion.

Each of the first terminal portions may be located proximate a first closed end. Each of the first terminal portions may contact, or may otherwise be electrically coupled with, the interconnects of the substrate. For example, a first terminal portion 124 of the first conductive path 122A may be coupled with the interconnects 110. In one aspect, the interconnects may optionally include pads that the first terminal ends or portions may be coupled with.

Each of the second terminal portions may emerge from a second open end and may reside outside of the openings. For example, a second terminal portion 123 of the first conductive path 122A may include a portion or tail that emerges from the second open end of the first opening 120 and overlies an area of the back side surface outside the opening.

Each of the central portions is disposed between respective first and second terminal portions. The central portions may be adjacent to, or may abut, the walls of the openings. For example, a central portion 125 of the first conductive path 122A may abut a first wall of the first opening 120. The conductive paths may be used to communicate electrical signals to and from the interconnects and to and from a signaling medium outside the opening.

As clearly shown in FIG. 1A, each of the openings may include multiple conductive paths. In particular, in the illustrated embodiment, the first opening 120 includes the first conductive path 122A and the second conductive path 122B (as well as others shown in FIG. 1B). Further, in the illustrated embodiment, the second opening 130 includes at least the third conductive path 132A and the fourth conductive path 132B (as well as others shown in FIG. 1B). The openings having the multiple conductive paths through them may represent vias having multiple electrical paths through the substrate.

The package further includes conductive pads or other terminals 128A-B, 138A-B coupled with the tails of the conductive paths. The conductive paths may include conductive materials or paths between the interconnects located toward the front side of the substrate and the terminals located on the back side or back side surface of the substrate. The conductive pads may include conductive metals, such as, for example, nickel, gold, copper, or the like, and combinations thereof. In one particular embodiment, the conductive pads may include a metal stack including a nickel layer closest to the back side surface of the substrate and a gold layer farther from the back side surface than the nickel layer, although the scope of the invention is not so limited. The conductive paths may conduct, convey, or otherwise communicate electrical signals between the interconnects and the terminals. For example, the conductive paths may be used to communicate control and/or information signals to and from the components A and B.

The terminals may be used to electrically couple the package with an external signaling medium, such as, for example, a circuit board, circuit, or other portion of an electronic device in which the package is deployed. Conductors, such as, for example, solder bumps, metal wires, or the like, may be connected between the terminals and the external signaling medium. In one aspect, the terminals may be connected to the external signaling medium through a surface mount technology (SMT), for example. In another aspect, a thin wire of highly conductive metal, such as, for example, gold, for example having a diameter of about thirty micrometers, may be used as a package lead to connect to the terminals.

FIG. 1B shows a bottom planar view of the microelectronic package. As previously mentioned, the section line 1A—1A shows the location of the cross-section used for FIG. 1A. As shown in FIG. 1B, the microelectronic package may optionally have a square footprint, although this is not required. The bottomside surface 107 of the substrate or semiconductor backplane is clearly visible in this bottom planar view.

The first opening 120 and the second opening 130 each open from the bottomside surface. In the illustrated embodiment, each of the openings has the shape of an inverted rectangular pyramidal frustum. A pyramidal frustum is a truncated pyramid in which the vertex is cut off so that the top has a polygonal shape. The inverted rectangular pyramidal frustum has an elongated rectangular and polygonal base that is coplanar with the bottomside surface. The walls of the openings represent trapezoidal faces that slant from the base to the polygonal flattened vertex. This particular size and shape of the openings is not required. Square, triangular, diamond shaped, and other polygonal shapes, as well as circular, oval, irregular, and other shapes are also suitable. Nor is it required that the walls slant, or that all of the walls slant, although this may potentially offer an advantage of depositing on a slanted rather than vertical surface, as will be explained further below.

The illustrated embodiment clearly shows that multiple conductive paths may be included within each of the openings in the silicon backplane or other substrate. In the particular illustrated embodiment, six conductive paths are included in the first opening 120 and six conductive paths are included in the second opening.

In particular, the first conductive path 122A, the second conductive path 122B, a fifth conductive path 122C, a sixth conductive path 122D, a seventh conductive path 122E, and an eighth conductive path 122F are included in the first opening 120. Likewise, the third conductive path 132A, the fourth conductive path 132B, a ninth conductive path 132C, a tenth conductive path 132D, an eleventh conductive path 132E, and a twelfth conductive path 132F are included in the second opening 130.

In the illustrated embodiment, the conductive paths are divided and arranged so that a set of three conductive paths resides on each side of each of the openings, although this is not required. In one or more embodiments of the invention, each set of the three conductive paths may include a signal line surrounded by two ground lines, although this is not required. A potential advantage of the openings and conductive paths disclosed herein is that lines may be routed and spacing of lines may be controlled, such as, for example, to achieve good radiofrequency performance.

By including multiple conductive paths in each hole, the number of holes in the silicon backplane or other substrate may be a fraction of, or may at least be less than, the number of conductive paths used for signal and ground connections to the package. This may potentially allow several semiconductor chips to be assembled into a substantially small form-factor module. This may also potentially allow the silicon backplane or other substrate to have greater mechanical strength and reliability when there are fewer holes formed through it. In addition, this may help to allow a thicker support portion of the silicon backplane or other substrate, since the holes may be spaced farther apart for a given aspect ratio, which may potentially be based on the silicon (1 1 1) plane angle.

As shown in the illustrated embodiment of FIG. 1B, the openings may optionally be located within the confines or perimeter of the substrate or silicon backplane. That is, the openings may be located toward the center of the substrate, or at least away from the confines or perimeter or sides of the substrate. However this is not required.

Figure 2A:
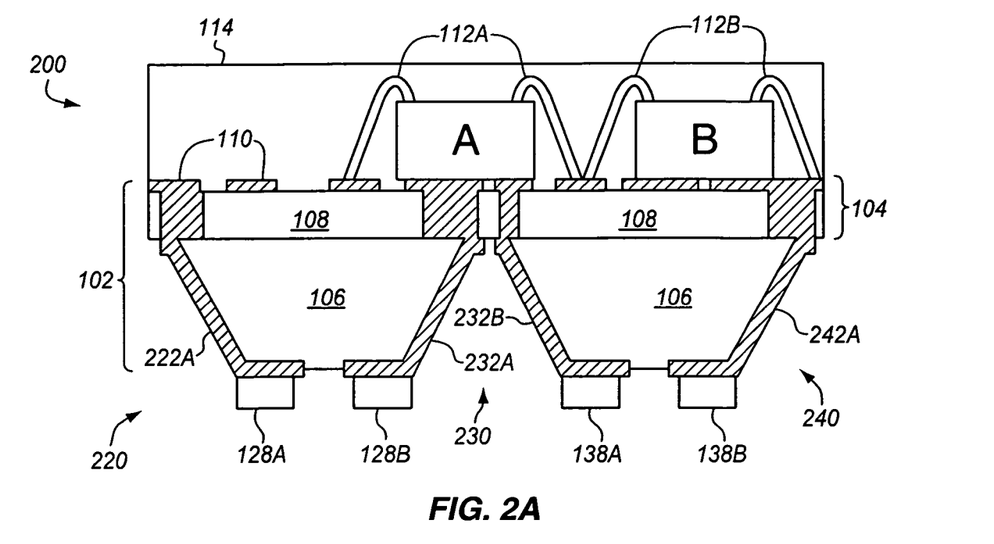
FIG. 2A is an enlarged cross-sectional view of another microelectronic package, according to one or more embodiments of the invention.
Figure 2B:
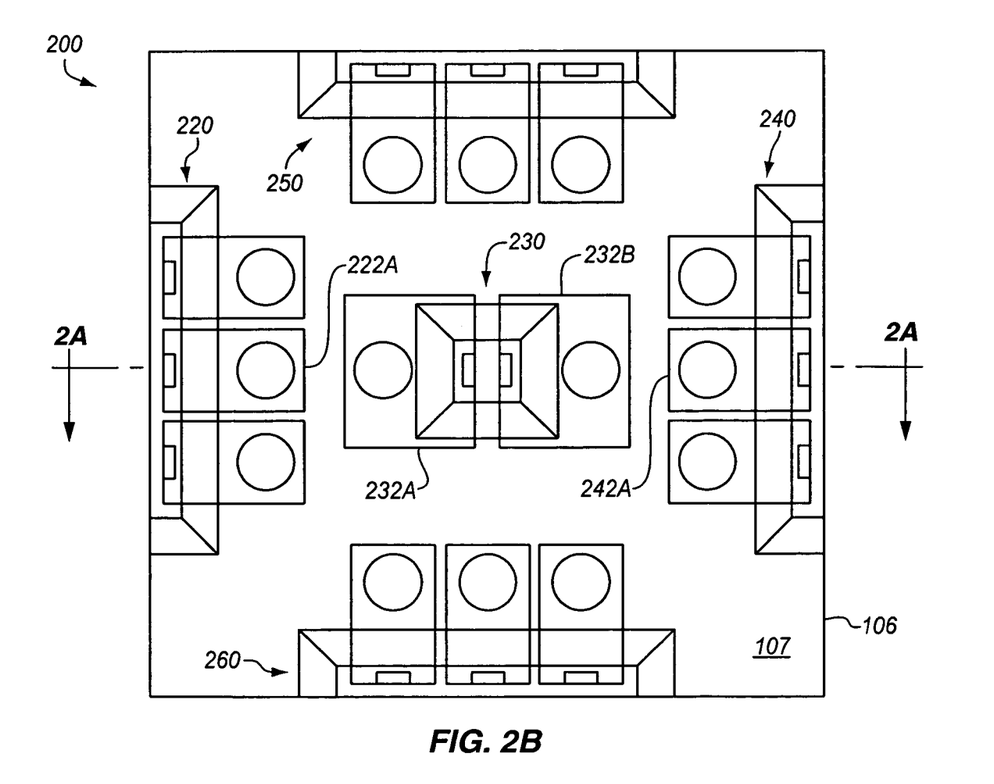
FIG. 2B is a bottom planar view of the microelectronic package of FIG. 2A, according to one or more embodiments of the invention.

FIGS. 2A and 2B show enlarged views of a microelectronic package 200, according to one or more embodiments of the invention. In particular, FIG. 2A shows a cross-sectional view of the microelectronic package and FIG. 2B shows a bottom planar view of the microelectronic package. The section line 2A—2A shown in FIG. 2B shows the location of the cross-section used for FIG. 2A.

Components shown in FIGS. 2A and 2B having the same reference numbers as those shown in FIGS. 1A and 1B may optionally have the same characteristics, although this is not required. To avoid obscuring the following description, the description will focus primarily on the distinctive features and characteristics of the package 200, in which different reference numbers are used to highlight components having the relatively more distinctive features and characteristics.

As shown in FIG. 2B, the package has a plurality of openings 220, 230, 240, 250, 260. As shown, some of the openings, such as, for example, opening 230, may be included toward or at the center of the substrate, while other of the openings, such as, for example, openings 220, 240, 250, and 250, may be included at the perimeter or sides of the substrate or package.

As will be explained further below, the openings at the perimeter or sides of the substrate or package may be formed in a wafer substrate and then the openings at the sides of the substrate may be singulated, dissected, or otherwise divided when the substrate is singulated or otherwise separated from the wafer substrate. A portion or the opening and a portion of the conductive paths, such as, for example, half, in one instance, may be shared between adjacent die substrates that are separated from the wafer substrate.

Each of the openings has a plurality of conductive paths. For example, opening 220 has conductive path 222A and two others, opening 230 has conductive paths 232A-B, and opening 240 has conductive path 242 and two others. Likewise, openings 250 and 260 each have three conductive paths.

Notice that the conductive paths of openings 220, 240, 250, and 260 are located toward or at the periphery or sides of the substrate or package. Providing the conductive paths at or toward the perimeter or sides of the substrate may help to improve radiofrequency performance, although this is optional and not required.

Other numbers, locations, arrangements, and configurations of openings and conductive paths are also contemplated, and will be apparent to those skilled in the art and having the benefit of the present disclosure. To further illustrate, let's consider a few possible variations. In various embodiments of the invention, either fewer or more openings may be used in a package. For example, as few as one opening, or a large number of openings may be used. Further, in various embodiments of the invention, differently sized and/or shaped openings may optionally be used in a package. For example, square or circular openings that are either larger or smaller than the illustrated openings may be used. The openings need not have the same size or shape. Still further, in various embodiments of the invention, either fewer or more conductive paths may be included in an opening. For example, at least two, at least three, multiples of three, a large number, and other numbers of conductive paths may optionally be used per opening, to name just a few examples. The number of conductive paths in the different openings in a package need not be the same. These are just a few exemplary variations and others are contemplated.

FIGS. 3A-3F show cross-sectional views of substrates and assemblies representing different stages of a method of making a microelectronic package in which the components A and B are assembled and overmolded at the die level, according to one or more embodiments of the invention. In this particular example, the final microelectronic package is similar to the microelectronic package shown in FIGS. 2A-2B, although the scope of the invention is not so limited.

Figure 3A:
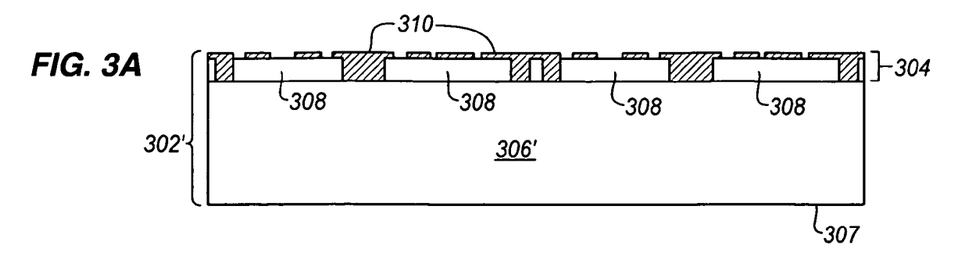
FIGS. 3A-3F show enlarged cross-sectional views of substrates and assemblies representing different stages of a method of making a microelectronic package in which microelectronic components are assembled and overmolded at the die level, according to one or more embodiments of the invention.

FIG. 3A shows a "thick" wafer-level substrate 302', according to one or more embodiments of the invention. The thick substrate may represent a wafer substrate having an array of unsingulated die substrates. The thick substrate includes a thick wafer-level support layer or portion 306' and a device and interconnect layer or portion 304. The device and interconnect layer or portion includes a plurality of semiconductor devices 308, such as, for example, passive components, and interconnects 310, such as, for example, surface metallization. In one or more embodiments of the invention, the passive components may be fabricated by conventional and well-known semiconductor processing techniques, such as, for example, thin film deposition, lithography, etching, and the like.

Figure 3B:
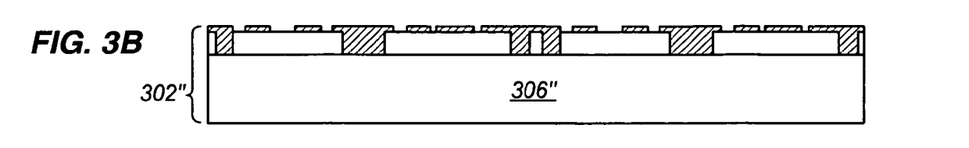

FIG. 3B shows a "thin" wafer-level substrate 302" formed by removing material from the back side surface 307 of the thick wafer-level substrate 302' of FIG. 3A, according to one or more embodiments of the invention. One suitable approach for removing the material is backgrinding, such as, for example, by chemical-mechanical polishing. Another suitable approach for removing the material is etching. The resulting thin substrate includes a thinned wafer-level support layer or portion 306", which is thinner than the thick support layer or portion 306'. In one or more embodiments of the invention, the thin substrate 302" may be thinned to a final thickness ranging from about 200 to about 400 microns, although the scope of the invention is not limited in this respect.

Figure 3C:
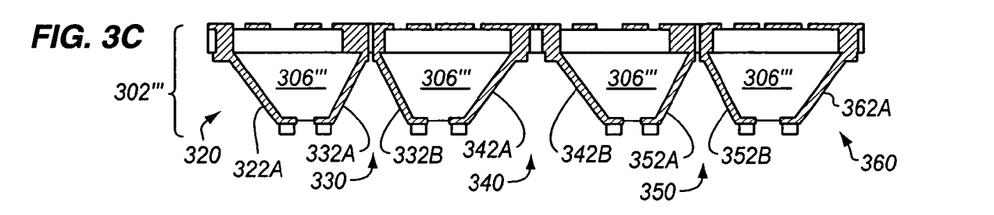

FIG. 3C shows a patterned wafer-level substrate 302''' formed by forming back side openings 320, 330, 340, 350, 360 in the thin substrate of FIG. 3B, and then forming conductive paths 322A, 332A-B, 342A-B, 352A-B, 362A, in at least some of the openings, according to one or more embodiments of the invention. A method, according to one embodiment of the invention, may include forming openings in a substrate similar to that shown in FIG. 3B, and then forming conductive paths in the openings. The starting substrate may be provided, such as, for example fabricated, or purchased or otherwise acquired from another manufacturer.

The substrate includes a patterned wafer-level support layer or portion 306'''. Notice that the openings and conductive paths are formed at the wafer level. Notice that at least some of the openings, such as, for example, openings 330, 340, and 350, and potentially others, have multiple conductive paths.

An exemplary method of forming the openings and the conductive paths, in accordance with one or more embodiments of the invention, will now be described. The openings may be formed by selectively removing material from the back side of the thin substrate. One suitable approach for removing material is etching according to a lithographically patterned mask layer with an etchant. In some cases the substrate may include a silicon wafer and one or more wet etchants, such as, for example, potassium hydroxide (KOH), ethylene-diamine pyrochatechol (EDP), tetramethyl ammonium hydroxide (TMAH), or combinations thereof, may be used to form the openings by etching material. In some cases the substrate may include a silicon wafer and one or more plasma etchants, such as, for example, sulfur hexafluoride (SF6), or vapor-phase etchants, such as, for example, xenon difluoride (XeF2), may be used to form the openings by etching material. Other suitable etchants are known in the arts for other types of substrates. As yet another option, the openings may also optionally be formed by micromachining, mechanical milling, laser ablation, or by other approaches.

Then, an electrically insulating layer may be deposited, grown, or otherwise formed over the back side surface of the resulting substrate. The electrically insulating layer may include an insulating or dielectric material, such as, for example, an oxide of silicon, such as silicon dioxide, a nitride of silicon, such as silicon nitride, an insulating organic material, such as a polymeric dielectric material, or other insulating or dielectric materials known in the arts. The thickness of the insulating layer may be sufficient to electrically insulate the electrical signals or currents in the conductive paths from other conductive portions of the substrate and may vary depending upon the insulating characteristics of the material.

Then, the conductive paths may be formed. In one or more embodiments of the invention, the conductive paths may include metal lines or traces. The metal lines or traces may include a conductive metal, such as, for example, copper, gold, or the like, or combinations thereof. Different ways of forming the metal lines or traces are contemplated.

An exemplary method of forming the metal lines or traces, in accordance with one or more embodiments of the invention, will now be described. The method may include forming a blanket resist layer over the back side surface of the substrate including within the openings. One suitable approach for forming the blanket resist layer may include spray coating the resist. Another suitable approach for forming the blanket resist layer may include electrodepositing the resist. Then the blanket resist layer may be patterned. In one or more embodiments of the invention, a high aspect ratio lithography approach may be used to pattern the blanket resist layer. For example, a mask aligner and 1:1 photomask may be used to expose the blanket resist layer including portions of the resist layer within the openings. Alternatively, a stepper may optionally be used. In one aspect, the patterning of the resist layer may allow removing portions of the resist layer where the metal lines or traces are to be formed and then these portions may be removed.

Then, the metal lines may be formed. As one example, an optional seed layer may be formed where the metal lines or traces are to be formed. One suitable approach for forming the seed layer may include sputtering or otherwise physically depositing a metal, such as, for example, copper, gold, or some other metal, although the scope of the invention is not limited in this respect. Then metal may be deposited on the seed layer, such as, for example, by plating. One suitable plating approach is electroplating. Another suitable plating approach is electroless plating. Other depositions, such as, for example, sputtering or other physical vapor depositions, or chemical vapor metal deposition with or without the optional seed layer may optionally be used. In one or more embodiments of the invention, the openings may have tapered walls to help facilitate deposition on the walls, although this is not required. Then the resist layer and any seed layer or other metal deposited on the resist layer may be removed, such as, for example, by stripping. An optional limited etch may optionally be performed after removing the resist layer to remove residual misplaced seed layer or other misplaced metal.

Another exemplary method of forming the metal lines or traces, in accordance with one or more other embodiments of the invention, will now be described. The method may include forming a blanket metal layer over the back side surface of the substrate including within the openings. One suitable approach for forming the blanket resist layer may include sputtering or another physical vapor deposition. Another suitable approach may include sputtering a seed layer and growing the metal layer by plating. Yet another suitable approach for forming the blanket metal layer may include a metal chemical vapor deposition. In one or more embodiments of the invention, the openings may have tapered walls to help facilitate deposition on the walls, although this is not required.

Then the blanket metal layer may be patterned. In one or more embodiments of the invention, a resist layer may be formed over the metal layer, such as, for example, by spray coating or electrodeposition. Then, lithography, such as, for example, high aspect ratio lithography, may be used to pattern the resist layer. In one aspect, the resist layer may be patterned so that the patterned resist layer only covers and protects the metal layer where the metal lines or traces are to remain. Then, a metal etch may be performed to remove portions of the metal layer except where the metal lines or traces are to remain. Then, the resist layer may be removed, such as, for example, by stripping. An optional limited metal etch may optionally be performed after removing the resist layer to remove residual misplaced metal.

These are just are just a few exemplary methods of how the openings and conductive paths may be formed. Other methods, such as, for example, those based on micromachining, are also contemplated. Still other methods will be apparent to those skilled in the art and having the benefit of the present disclosure.

Then, after the conductive paths have been formed, pads or other terminals may be formed over the tail or terminal ends of the conductive paths. In one or more embodiments of the invention, a solder mask may be used for a patterned deposition of materials of the pads. For example, a first patterned deposition of several microns of a first metal, such as, for example, nickel, may first be performed, and then a second patterned deposition of several microns of a second metal, such as, for example, gold, may be performed, although the scope of the invention is not limited in this respect. The metal pads may be suitable for soldering to a circuit board, for example.

Figure 3D:
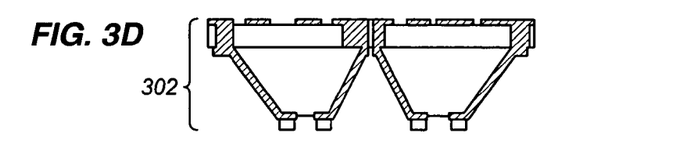

FIG. 3D shows a patterned die-level substrate 302 formed by singulating or otherwise severing the patterned wafer-level substrate of FIG. 3C, according to one or more embodiments of the invention. The singulation or severing may be formed by cutting between two die-level substrates and/or around the perimeter of the die-level substrates with a singulation or dicing saw. The die-level substrate may include portions of the wafer-level substrate that correspond to a single microelectronic package.

Figure 3E:
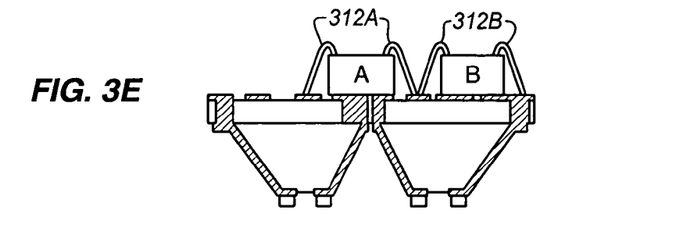

FIG. 3E shows a die-level assembly formed by electrically coupling components A and B to the die-level substrate of FIG. 3D. In one or more embodiments of the invention, the components may include die fabricated by different semiconductor manufacturing processes, although this is not required. As shown in the illustrated embodiment of the invention, the components may be assembled at the die-level and after singulation, although this is not required. As further shown in the illustrated embodiment, the components A and B may respectively be electrically coupled with a die-attach process and with a first 312A and second 312B sets of wirebonds. However, this is not required. As another option, flipchip joints (not shown) may be used.

Figure 3F:
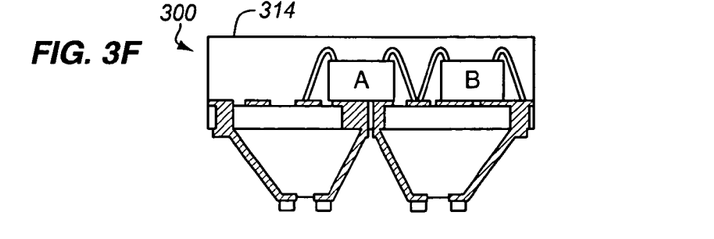

FIG. 3F shows a microelectronic package 300 after forming a molding compound or encapsulant 314 over the front side surface of the assembly of FIG. 3E, according to one or more embodiments of the invention. As shown, in one or more embodiments of the invention, the overmolding or encapsulation may be performed at the die-level and after singulation.

FIGS. 4A-4D show cross-sectional views of substrates and assemblies representing different stages of a method of making a microelectronic package in which the components A and B are assembled and overmolded at the wafer level, according to one or more embodiments of the invention. In this particular example, the final microelectronic package is similar to the microelectronic package shown in FIGS. 2A-2B, although the scope of the invention is not so limited.

Figure 4A:
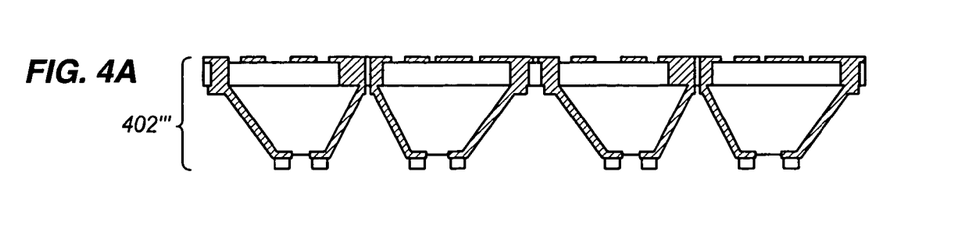
FIGS. 4A-4D show enlarged cross-sectional views of substrates and assemblies representing different stages of a method of making a microelectronic package in which microelectronic components are assembled and overmolded at the wafer level, according to one or more embodiments of the invention.

FIG. 4A shows a patterned wafer-level substrate 402''', according to one or more embodiments of the invention. The patterned wafer-level substrate 402''' may optionally be formed similarly to the patterned wafer-level substrate 302''' shown in FIG. 3C, or by another method entirely.

Figure 4B:
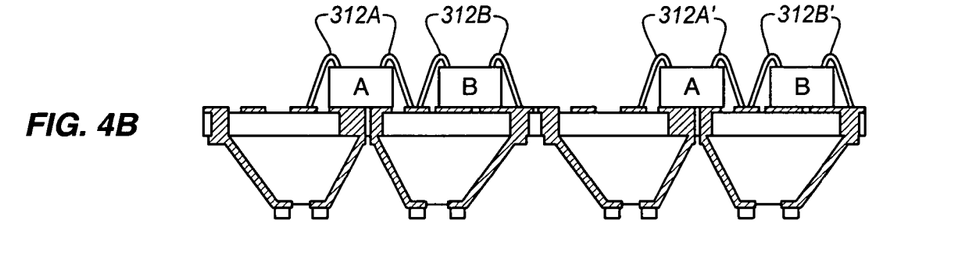

FIG. 4B shows a wafer-level assembly formed by electrically coupling a sets of components to the wafer-level substrate 402''' of FIG. 4A, according to one or more embodiments of the invention. As shown, the components may be electrically coupled or assembled at the wafer-level. In the illustrated embodiment a first set of components A and B and a second set of components A and B are assembled with corresponding wirebonds 312A-B and 312A'-B', although it is to be appreciated that an array of such components may optionally be assembled to an array of unsingulated die substrates of the wafer substrate.

Figure 4C:
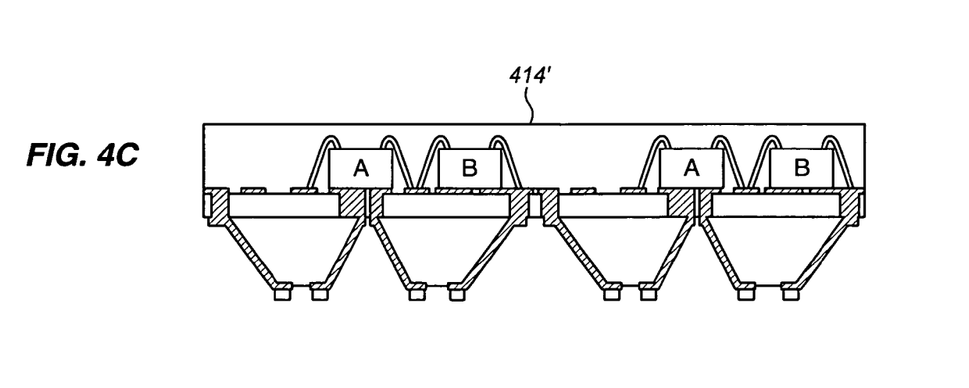

FIG. 4C shows an overmolded wafer-level assembly formed by overmolding or encapsulating the front side of the wafer-level assembly of FIG. 4B, according to one or more embodiments of the invention. A rigid encapsulant or overmolding material 414' covers the front side of the wafer-level assembly. As shown, the overmolding or encapsulation may be performed at the wafer level and before singulation. By way of example, the overmnolding may be performed in a batch process. The encapsulant or rigid overmolding material may protect the components and wirebonds and may serve as a rigid support for subsequent processing of the wafer and assembly.

Figure 4D:
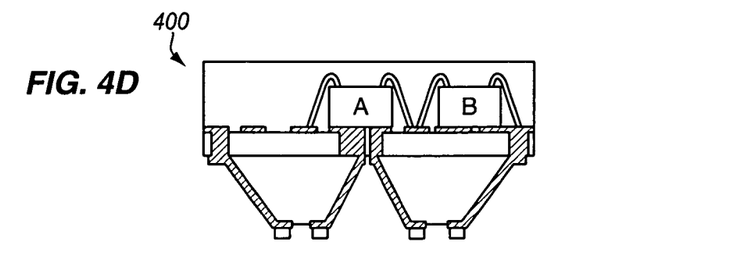

FIG. 4D shows a microelectronic package 400 formed by singulating or otherwise severing the overmolded wafer-level assembly of FIG. 4C, according to one or more embodiments of the invention. As shown, in the illustrated embodiment, singulation may be performed last, once all of the other operations of fabricating the microelectronic packages, including component attachment and overmolding, have been performed. The overmolding may help to protect the components A and B, the interconnects, and the passives, during singulation.

FIGS. 5A-5F show cross-sectional views of substrates and assemblies representing different stages of a method of making a microelectronic package in which the components A and B are assembled at the wafer level before formation of the openings and conductive paths, according to one or more embodiments of the invention. As before, in this particular example, the final microelectronic package is similar to the microelectronic package shown in FIGS. 2A-2B, although the scope of the invention is not so limited.

Figure 5A:
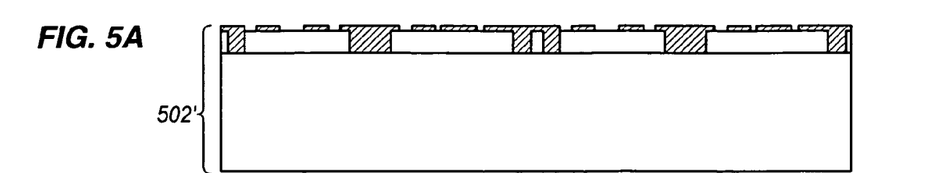
FIGS. 5A-5F show enlarged cross-sectional views of substrates and assemblies representing different stages of a method of making a microelectronic package in which microelectronic components are assembled at the wafer level before formation of the openings and conductive paths, according to one or more embodiments of the invention.

FIG. 5A shows a thick wafer-level substrate 502', according to one or more embodiments of the invention. The thick wafer-level substrate 502' may be similar to the thick wafer-level substrate 302' shown in FIG. 3A.

Figure 5B:
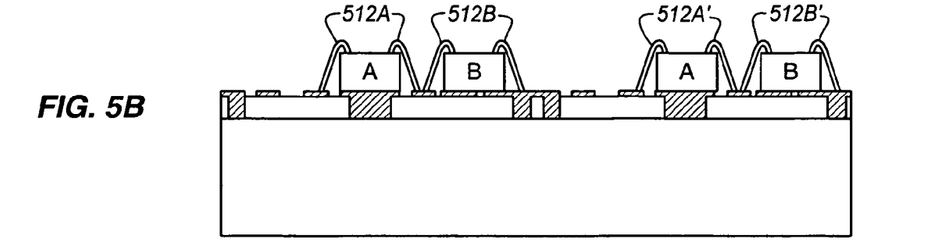

FIG. 5B shows a wafer-level assembly formed by electrically coupling sets of components to the wafer-level substrate 502' of FIG. 5A, according to one or more embodiments of the invention. As shown, the components may be electrically coupled or assembled at the wafer-level. In the illustrated embodiment a first set of components A and B and a second set of components A and B are assembled. Component A of the first set is assembled with a first set of wirebonds 512A, component B of the first set is assembled with a second set of wirebonds 51 2B, component A of the second set is assembled with a third set of wirebonds 512A', and component B of the second set is assembled with a fourth set of wirebonds 51 2B'. It is to be appreciated that an array of such components may optionally be assembled to an array of unsingulated die substrates of the wafer substrate. Notice that the components may be assembled or electrically coupled before formation of the openings and conductive paths.

Figure 5C:
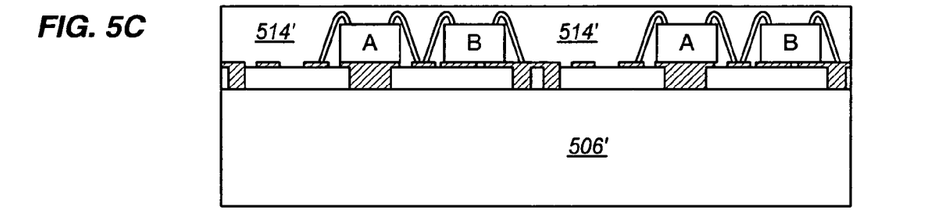

FIG. 5C shows an overmolded wafer-level assembly formed by overmolding or encapsulating the front side of the wafer-level assembly of FIG. 5B, according to one or more embodiments of the invention. A rigid encapsulant or overmolding material 514' covers and/or encapsulates the front side of the wafer-level assembly. As shown, the overmolding or encapsulation may be performed at the wafer level and before singulation. As further shown, the overmolding or encapsulation may be performed before the openings and conductive paths are formed. The encapsulant or rigid overmolding material may protect the components and wirebonds and may serve as a rigid support for subsequent processing of the wafer and assembly. The overmolded wafer-level assembly still has a substrate with a relatively thick support layer or portion 506'.

Figure 5D:
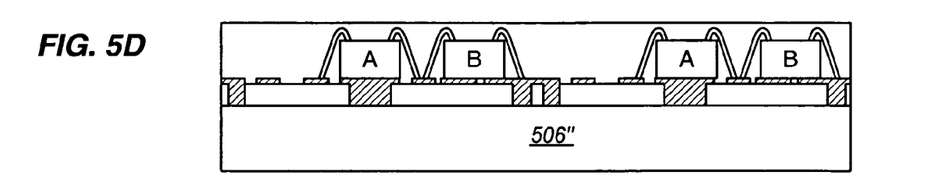

FIG. 5D shows a thin overmolded wafer-level assembly formed by polishing, etching, or otherwise removing material from the back side of the thick substrate of the overmolded wafer-level assembly of FIG. 5C, according to one or more embodiments of the invention. The support portion 506" of the substrate is thinner than the support portion 506" of the substrate of FIG. 5C.

Figure 5E:
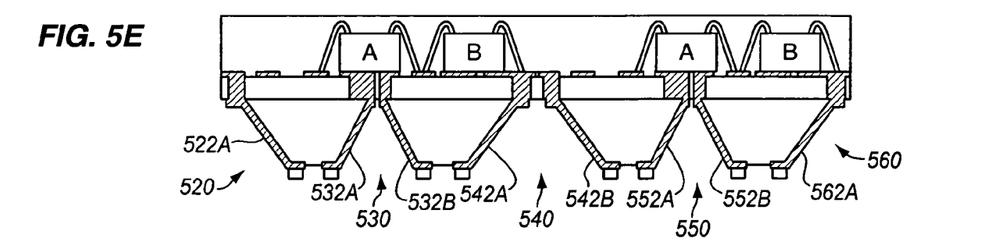

FIG. 5E shows a patterned overmolded wafer-level assembly formed by forming back side openings 520, 530, 540, 550, 560 in the thin support portion of the substrate of FIG. 5D, and then forming conductive paths 522A, 532A-B, 542A-B, 552A-B, 562A, in at least some of the openings, according to one or more embodiments of the invention. Notice that at least some of the openings, such as, for example, openings 530, 540, and 550, and potentially others, may have multiple conductive paths. Notice also that the openings and conductive paths may be formed at the wafer level and before singulation. Notice also that the openings and conductive paths may be formed after overmolding and before singulation.

Figure 5F:
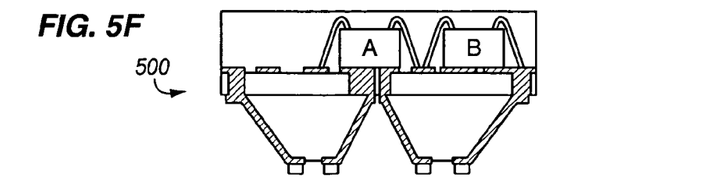

FIG. 5F shows a microelectronic package 500 formed by singulating or otherwise severing the overmolded wafer-level assembly of FIG. 5E, according to one or more embodiments of the invention. As shown, in the illustrated embodiment, singulation may be performed last, once all of the other operations of fabricating the microelectronic packages, including component attachment and overmolding, have been performed. The overmolding may help to protect the components A and B, the interconnects, and the passives, during singulation.

Figure 6:
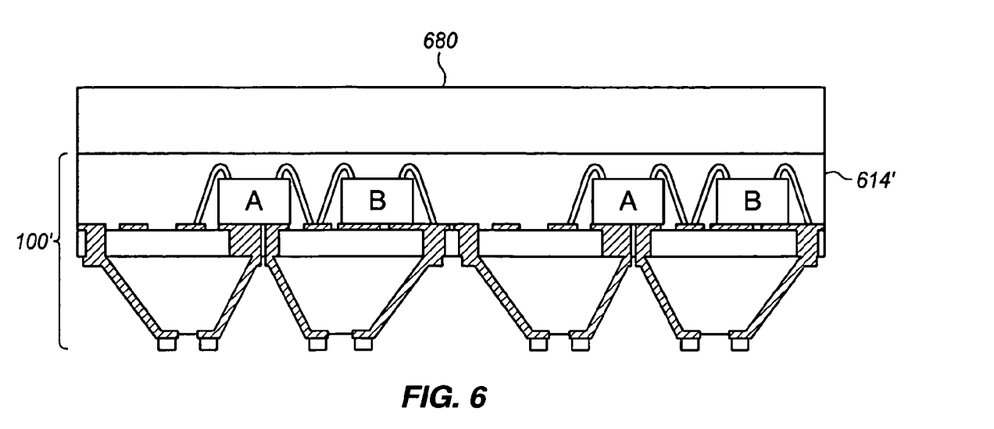
FIG. 6 is an enlarged cross-sectional showing a structural support wafer bonded with an encapsulated wafer assembly, according to one or more embodiments of the invention.

FIG. 6 is an enlarged cross-sectional view showing an optional structural support wafer 680, such as, for example, a silicon wafer, bonded with a wafer-level assembly of microelectronic packages 100' by cured or otherwise solidified encapsulant 614', according to one or more embodiments of the invention. The structural support wafer may help to improve the strength and/or planarity of the assembly and microelectronic packages obtained therefrom. The structural support wafer may be applied to the encapsulant or molding compound prior to full solidification. The solidification of the encapsulant may help to bond the support wafer to the assembly. Other adhesives besides or in addition to encapsulants and molding compounds may also optionally be used to bond the structural support wafer to the assembly. As one aspect, a thick spin-on polymer material, such as molding compounds, photoresist, epoxy, benzocyclobutene (BCB), or the like, may be used.

Figure 7:
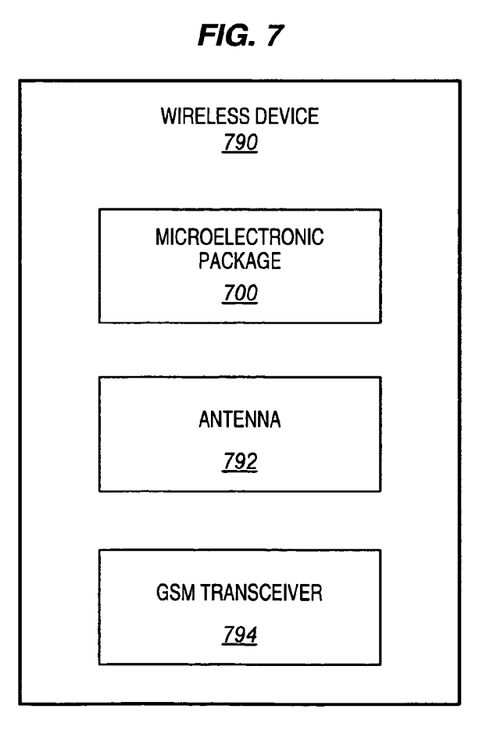
FIG. 7 shows a wireless device, according to one or more embodiments of the invention.

The modules disclosed herein may be included and employed in a wide variety of electronic devices including, but not limited to, wireless devices. FIG. 7 shows a wireless device 790, according to one or more embodiments of the invention. By way of example, the wireless device may include a cellular phone, pager, personal digital assistant (PDA), computer card (for example local area network (LAN) card), or laptop computer, to name just a few examples.

The wireless device includes a microelectronic package 700. The package may have any one or more of the characteristics of the packages described elsewhere herein. In one embodiment of the invention, the package may be employed as a front-end module (FEM), or a smart antenna, for example, for a wireless device supporting a cellular, wireless local area network (WLAN), or ultrawideband (UWB) standard, for example.

The wireless device also includes an antenna 792. In one or more embodiments of the invention, the antenna may comprise a planar antenna. Suitable planar antennas include, but are not limited to, microstrip antennas and printed antennas. Alternatively, in one or more embodiments of the invention, the antenna may include a dipole antenna. In one or more embodiments of the invention, the antenna may include an onmidirectional antenna. The antenna may allow the wireless device to send and receive data. Planar antennas, dipole antennas, and omnidirectional antennas are types of antennas that are used in some, but not all, wireless devices.

The wireless device also includes an optional GSM (Global System for Mobile communications) transceiver 794. The GSM transceiver may allow the apparatus to utilize CDMA (Code Division Multiple Access), TDMA (Time Division Multiple Access), and/or W-CDMA (Wideband Code Division Multiple Access) communications, for example. GSM transceivers are each used in some, but not all, wireless devices.

The wireless device may also optionally include other components. For example, some, but not all, cellular phones may include a Flash memory. As another example, some, but not all, laptop computers may include a dynamic random access memory (DRAM), a graphics controller, and/or an audio device.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

Various operations and methods have been described. Some of the methods have been described in a basic form, but operations may optionally be added to and/or removed from the methods. The operations of the methods may also often optionally be performed in different order. Many modifications and adaptations may be made to the methods and are contemplated.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Such recitations do not necessarily refer to the same embodiment. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. An apparatus comprising:
   a substrate having a first side and a second side;
   passive components located on the first side of the substrate;
   interconnects located on the first side of the substrate and electrically coupled with the passive components;
   microelectronic components on the first side of the substrate and electrically coupled with the interconnects;
   an opening in the substrate, the opening leading from the second side of the substrate toward the first side of the substrate; and
   a plurality of conductive paths in the opening, each of the conductive paths leading from the second side of the substrate toward the first side of the substrate to communicate electrical signals to the interconnects, wherein at least two conductive paths are routed on a side of the opening.

2. The apparatus of claim 1, wherein the conductive paths comprise metal lines.

3. The apparatus of claim 1, wherein each of the conductive paths comprises:
   a first terminal end adjacent to the interconnects;
   a second terminal end outside of the opening at the second side of the substrate; and
   a central length disposed between the first and second terminal ends, the central length adjacent to a wall of the opening.

4. The apparatus of claim 1, wherein the opening comprises a slanted wall.

5. The apparatus of claim 4, wherein the wall slants inward from the second side of the substrate.

6. The apparatus of claim 4, wherein the wall has an angle of about fifty-Four degrees relative to a major surface of the second side.

7. The apparatus of claim 1, wherein at least three conductive paths are routed on a side of the opening.

8. The apparatus of claim 1, wherein the opening is at a periphery of the substrate.

9. The apparatus of claim 1, wherein the opening is located toward a center of the substrate.

10. The apparatus of claim 1, wherein the substrate comprises a semiconductor substrate.

11. The apparatus of claim 1:
    wherein the passive components comprise capacitors and inductors;
    wherein the passive components each include a portion of one or more patterned layers that overly the substrate; and
    wherein the microelectronic components are selected from power amplifiers, a low-noise amplifiers, and solid-state switches.

12. The apparatus of claim 1, wherein the conductive paths comprise at least six conductive paths.

13. The apparatus of claim 1, wherein the conductive paths comprise at least three conductive pats selected from metal traces and metal lines.

14. The apparatus of claim 1, further comprising a conductive pad coupled with an end of each of the plurality of conductive paths.

15. The apparatus of claim 1, included within a front end module (FEM).

16. The apparatus of claim 1, wherein the substrate comprises a silicon backplane.

17. The apparatus of claim 1, wherein the passive components each include a portion of one or more patterned layers that overly the substrate.

18. The apparatus of claim 1, wherein the microelectronic components comprise a plurality of semiconductor dice that have been fabricated by different fabrication processes.

19. A system comprising:
    a dipole antenna; and
    a microelectronic package in communication with the dipole antenna, the microelectronic package comprising;
    a substrate having a first side and a second side;
    passive components located on the first side of the substrate;
    interconnects located on the first side of the substrate and electrically coupled with the passive components;
    microelectronic components on the first side of the substrate and electrically coupled with the interconnects;
    an opening in the substrate, the opening leading from the second side of the substrate toward the first side of the substrate; and
    a plurality of conductive paths in the opening, each of the conductive paths leading from the second side of the substrate toward the first side of the substrate to communicate electrical signals to the interconnects, wherein the plurality of the conductive paths in the opening comprise at least one signal line and at least one ground line.

20. The system of claim 19, wherein the conductive paths comprise metal lines.

21. The system of claim 19, wherein the opening comprises a slanted wall, and wherein the wall slants inward from the second side of the substrate.

22. The system of claim 19, wherein the opening is at a periphery of the substrate.

23. The system of claim 19, wherein the substrate comprises a semiconductor substrate.

* * * * *

UNITED STATES PATENT AND TRADEMARK OFFICE
CERTIFICATE OF CORRECTION

| | | |
|---|---|---|
| PATENT NO. | : 7,358,615 B2 | Page 1 of 1 |
| APPLICATION NO. | : 11/240750 | |
| DATED | : April 15, 2008 | |
| INVENTOR(S) | : Heck et al. | |

It is certified that error appears in the above-identified patent and that said Letters Patent is hereby corrected as shown below:

In column 16, at line 10, delete "pats" and insert --paths--.

Signed and Sealed this

Eighteenth Day of November, 2008

JON W. DUDAS
*Director of the United States Patent and Trademark Office*